(12) United States Patent
Kobayashi et al.

(10) Patent No.: US 8,115,552 B2
(45) Date of Patent: Feb. 14, 2012

(54) AMPLIFIER CIRCUIT WITH STEP GAIN

(75) Inventors: Bun Kobayashi, Cypress, CA (US);
Steven W. Schell, Torrance, CA (US);
Yonghan Chris Kim, La Mirada, CA
(US); Pei-Ming Daniel Chow, Los
Angeles, CA (US); **Mau-Chung Frank
Chang**, Los Angeles, CA (US)

(73) Assignee: Microchip Technology Incorporated,
Chandler, AZ (US)

( * ) Notice: Subject to any disclaimer, the term of this
patent is extended or adjusted under 35
U.S.C. 154(b) by 0 days.

(21) Appl. No.: 12/685,635

(22) Filed: Jan. 11, 2010

(65) Prior Publication Data
US 2011/0169573 A1 Jul. 14, 2011

(51) Int. Cl.
*H03G 3/30* (2006.01)
(52) U.S. Cl. ....................................... 330/281; 330/285
(58) Field of Classification Search .................. 330/281,
330/284, 285
See application file for complete search history.

(56) References Cited

U.S. PATENT DOCUMENTS

| 4,366,450 | A | 12/1982 | Suganuma | |
|---|---|---|---|---|
| 4,458,212 | A | 7/1984 | Brehmer et al. | 330/260 |
| 5,355,096 | A | 10/1994 | Kobayashi | |
| 5,493,255 | A | 2/1996 | Murtojarvi | 330/296 |
| 5,661,437 | A | 8/1997 | Nishikawa | |
| 5,710,523 | A | 1/1998 | Kobayashi | 330/293 |
| 6,278,328 | B1 * | 8/2001 | Yamamoto et al. | 330/298 |
| 6,522,195 | B2 | 2/2003 | Watanabe et al. | |
| 6,906,595 | B2 | 6/2005 | Kim et al. | |
| 6,977,552 | B2 | 12/2005 | Macedo | |
| 7,046,081 | B2 | 5/2006 | Lin | |
| 7,332,964 | B2 | 2/2008 | Zhan et al. | |
| 7,423,487 | B2 | 9/2008 | Fornasari et al. | |
| 2004/0227569 | A1 | 11/2004 | Lin | 330/51 |
| 2005/0024150 | A1 | 2/2005 | Gordon et al. | 330/307 |
| 2009/0015334 | A1 | 1/2009 | Bakalski | |

OTHER PUBLICATIONS

PCT Search Report Application No. PCT/US2011/020042 (2 pages),
Jun. 3, 2011.

* cited by examiner

*Primary Examiner* — Steven J Mottola
(74) *Attorney, Agent, or Firm* — King & Spalding L.L.P.

(57) ABSTRACT

A step gain amplifier has an amplifier with an input and an output, and a bias circuit connected to the input and to a bias node. A passive feedback circuit using only passive elements connects the output to the input. A control circuit is connected to the bias circuit at the bias node.

19 Claims, 2 Drawing Sheets

AMPLIFIER CIRCUIT WITH STEP GAIN

TECHNICAL FIELD

The present invention relates to an amplifier circuit that can provide a high step gain with reduced current consumption, with little or no distortion to RF signal transmission at low gain state.

BACKGROUND OF THE INVENTION

Amplifier circuits with gains are well known in the art. See for example, U.S. Pat. Nos. 4,366,450; 5,355,096; 5,661,437; 7,046,081; 6,906,595; 7,332,964; 6,522,195; 6,977,552; 7,423,487; and USP publication 2009/0015334. Typically, the prior art amplifier circuit comprises an amplifier with a feedback circuit. The feedback circuit can be with either active elements or with passive elements. One prior art amplifier circuit with an amplifier and an active feedback circuit is shown in FIG. 9 of U.S. Pat. No. 5,661,437. The problem with this amplifier circuit is that the variable gain step is as small as 14 dB. The amplifier circuit has very low gain due to the fact that both of the high gain and low gain have negative values of −2.5 dB and −16.5 dB respectively. Another prior art amplifier circuit with an amplifier and a bias circuit with switches as the active feedback elements is shown in FIG. 1 of U.S. Pat. No. 6,977,552. In this prior art circuit, the manufacturing cost is believed to be high because there are two types of transistors used. The gain step of the amplifier circuit is also limited by the gain of the amplifier, because the RF signal is only bypassed by the switches at a low gain mode. Moreover, the output power ability and linearity are limited by the switches.

It is therefore desirable to have an amplifier system with a high step gain with reduced current consumption, with little or no distortion to RF signal transmission at low gain state.

SUMMARY OF THE INVENTION

Accordingly, in the present invention, an amplifier system comprises an amplifier having an input and an output, and a bias circuit. A passive feedback circuit having only passive elements connects the output to the input. A control circuit is connected to the bias circuit.

DETAILED DESCRIPTION OF THE PREFERRED EMBODIMENT

Figure 1:
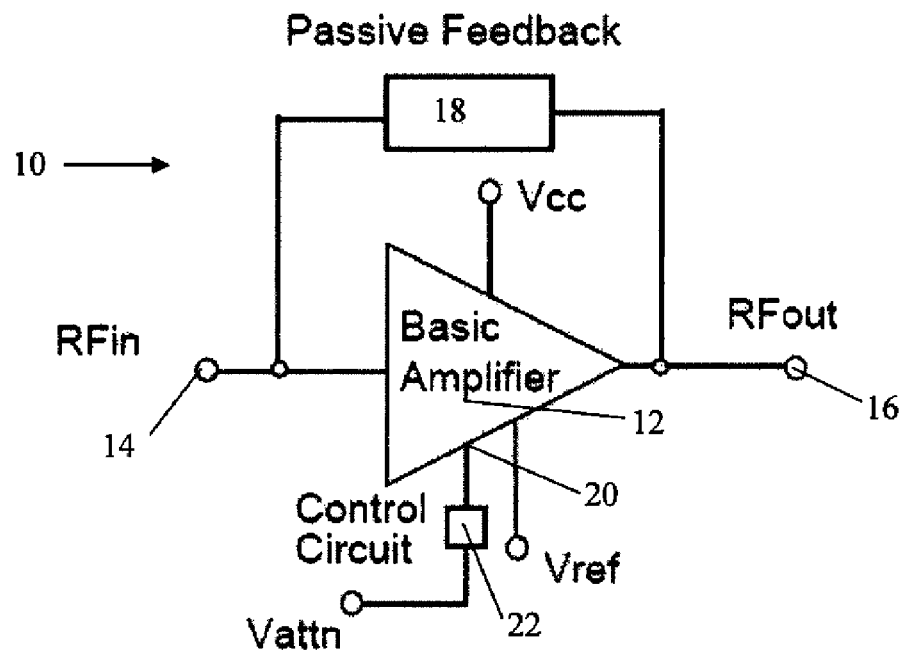
FIG. 1 is a schematic block level diagram of the amplifier system of the present invention.

Referring to FIG. 1 there is shown a block level diagram of an amplifier system 10 of the present invention. The amplifier system 10 comprises a basic amplifier 12 having an input 14 and an output 16. The input 14 can receive. RF signals thereby providing amplified RF signals at the output 16. The amplifier 12 is supplied with a voltage Vcc, as well as a reference voltage Vref. In addition, the amplifier system 10 also comprises a passive feedback circuit 18, which is connected to the output 16 at one end and to the input 14 at another end. Thus, the passive feedback circuit 18 connects the output 16 of the amplifier 12 with the input 14 of the amplifier 12. As will be described in greater detail hereinafter, the passive feedback circuit 18 consists only of passive elements, i.e. resistors, capacitors and inductors. Finally, as will be shown the amplifier 12 has a bias circuit, and a bias node 20. A control circuit 22 is connected to the bias node 20. The control circuit 22 receives a control signal Vattn.

Figure 2:
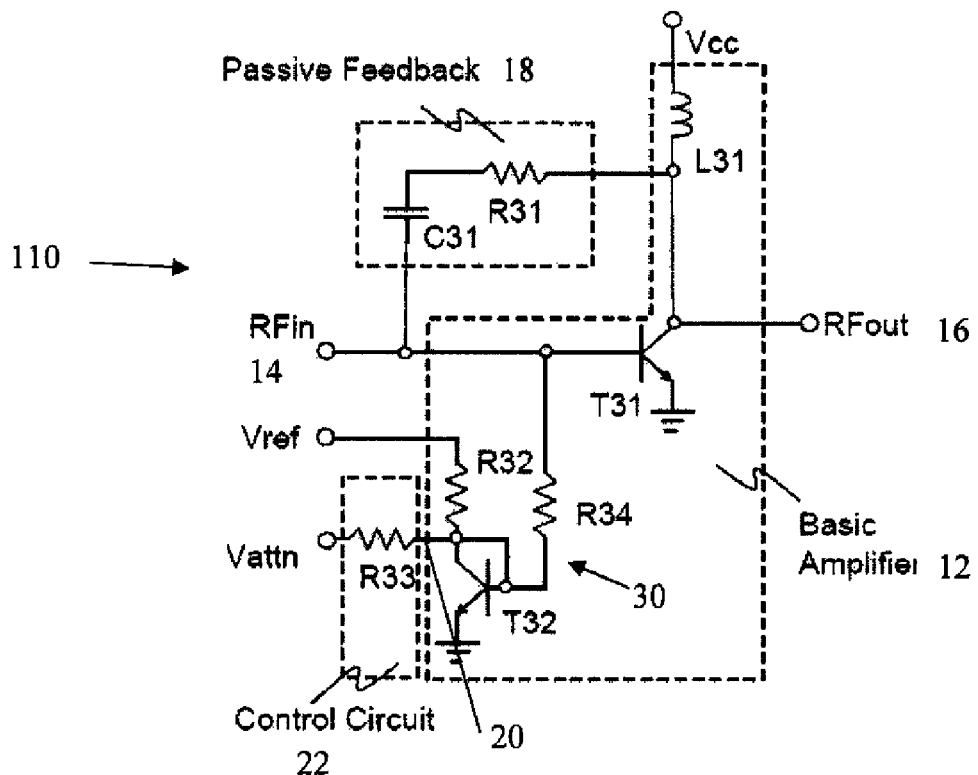
FIG. 2 is a circuit diagram of a first embodiment of the amplifier system of the present invention.

Referring to FIG. 2 there is shown a circuit diagram of a first embodiment of the amplifier system 110 of the present invention. Where similar parts are described like numerals will be used. The amplifier system 110 comprises a basic amplifier 12. The basic amplifier 12 comprises a first n-p-n bipolar transistor T31. However, as it will be clear to those in the art, the first n-p-n transistor T31 need not be limited to n-p-n type (for example, it can be p-n-p) nor is it limited to bipolar (e.g. it can be an FET type transistor). Nevertheless, for explanation of the invention, reference will be made to the first transistor T31 as being of n-p-n bipolar type. As is well known to those skilled in the art, a n-p-n type bipolar transistor, has an emitter, a collector and a base. The base of the first n-p-n transistor T31 is connected to the RF input 14 node. The collector of the first n-p-n transistor T31 supplies the RF output node 16. The emitter of the first transistor T31 is connected to ground. The collector of the first transistor T31 is also connected to a voltage source Vcc through an inductor L31. In addition, the collector of the first transistor T31 is connected to the passive feedback circuit 18, which comprises a resistor R31 connected in series with a capacitor C31, and to the input 14. Finally, the basic amplifier 12 comprises a bias circuit 30 connected to the base of the first transistor T31. The bias circuit 30 comprises a second n-p-n bipolar transistor T32. The base of the second transistor T32 is connected to its collector terminal as well as to the base of the first transistor T31 through a resistor R34. The emitter of the second transistor T32 is connected to ground. The collector of the second transistor T32 is also connected the bias node 20 as well as through a resistor R32 to a voltage source Vref Finally, the control circuit 22 of the amplifier system 110 comprises a resistor R33, which is connected to the bias node 20, and receives the signal Vattn.

In the operation of the amplifier system 110 of the present invention, the capacitor C31 in the passive feedback circuit 18 acts as a DC block to block DC signals. Thus, the feedback value of the amplifier system 110 is determined by the resistor R31. The bias circuit 30, which consists of second transistor T32, resistors R32 and R34 acts as a current mirror to the first transistor T31. In the operation of the amplifier system 110, when Vattn is at a high level, such as 2V, first transistor T31 is turned on. The RF signal supplied at the input node 14 is amplified by first transistor T31 with the feedback provided by the feedback circuit 18. However, the total close-loop gain of the amplifier system 10 is still high because of the high resistance of resistor R31. The close loop gain of the amplifier system 10 can be calculated as:

$$GH(\text{Closed Loop Gain}) = Go(\text{Gain of amplifier 12})1/(1+Go/R31))$$

When Vattn is at a low level, such as 0 volts, and Vref maintains high voltage, the voltage of the bias node 20 become low level. The current mirror circuit or bias circuit 30 is turned off. Thus, first transistor T31 is turned off. The RF signal provided at the input node 14 is not passed through the amplifier 12. Instead, the RF signal is passed to the RF output node 16 through the passive feedback circuit 18. However, since the resistance of R31 is high, there will be a large loss for the RF signal. In addition, the first transistor T31 is turned off, and the current mirror circuit or the bias circuit 30 is also turned off, current consumption is reduced in this low gain state. In addition, in this low gain state, because the RF signal goes through the passive elements of C31 and R31 there is no distortion of the RF signal.

As between the high gain state and the low gain state, there is a large gain difference between the two states. Thus, the amplifier system 10 is able to achieve a high gain step.

Figure 3:
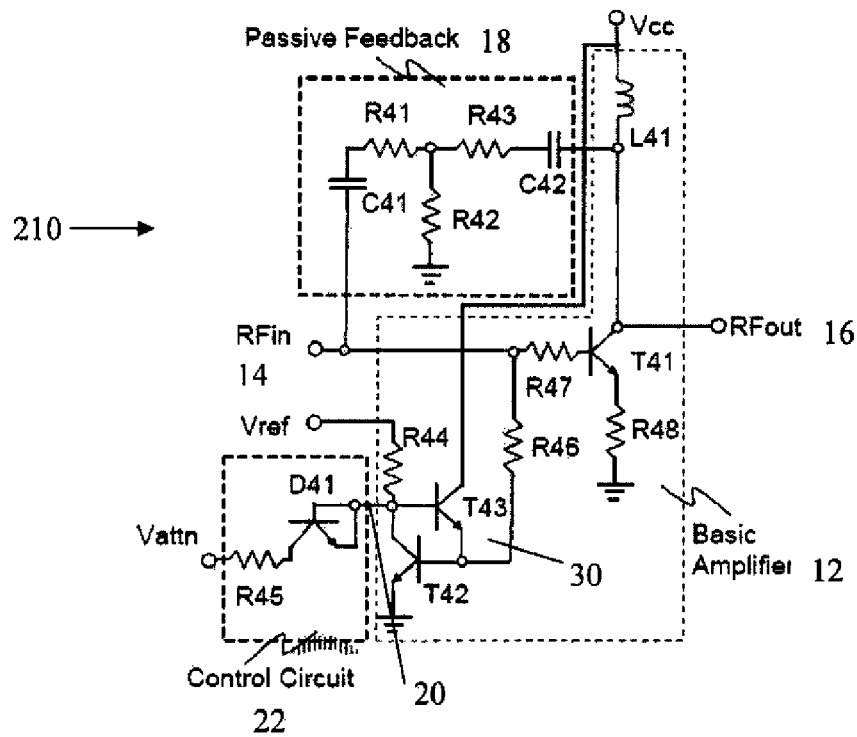
FIG. 3 is a circuit diagram of a second embodiment of the amplifier system of the present invention

Referring to FIG. 3 there is shown a second embodiment of the amplifier system 210 of the present invention. Again, same numerals will be used for like parts. The amplifier system 210 comprises a basic amplifier 12. The basic amplifier 12 includes a bias circuit 30, and a first transistor T41. Again, in this embodiment, the first transistor T41 is shown as a n-p-n bipolar transistor. However, the invention is not so limited. The first transistor T41 has a collector which is connected to the RF output node 16. In addition, the collector is connected through an inductor L41 to a voltage source Vcc. The first transistor T41 has an emitter connected through a resistor R48 to ground. Finally, the first transistor T41 has a base, which is connected through a resistor R47 to the RF input node 14.

The bias circuit 30, also functions as a current mirror circuit to the transistor T41, the bias circuit 30 comprises a second n-p-n bipolar transistor T42, and a third n-p-n bipolar transistor T43. The emitter of the second transistor T42 is connected to ground. The collector of the second transistor T42 is connected to the base of the third transistor T43. The base of the second transistor T42 is connected to the emitter of the third transistor T43 and through a resistor R46 to resistor R47, and into the base of the first transistor T41. The collector of the third transistor T43 is connected to Vcc. The base of the third transistor T43 is connected through resistor R44 and into Vref. The base of the third transistor T43 is also connected to the control circuit 22 at the bias node 20.

The control circuit 22 comprises a fourth bipolar transistor D41. The base of the fourth transistor 1341 is connected to its emitter which is also connected to the bias node 20. The collector of the fourth transistor D41 is connected through a resistor R45 and receives the control signal Vattn.

The passive feedback circuit 18 comprises a first capacitor C42 connected to a resistor R43 in series, and in series with a resistor R41 in series with a second capacitor C41. The first capacitor C42 is also connected to the collector of the first transistor T41. The second capacitor C41 is connected to the RF input node 14. A resistor R42 connects the junction of the resistor R41 and R43 to ground.

In the operation of the amplifier system 210 of the present invention, the connection of the resistors R41, R42 and R43 in the passive feedback circuit 18 provides better impedance matching. The resistors R47 and R48 provide DC ballast for the first transistor T41. Finally, the third transistor T43 provides increased current mirror capability to the bias circuit 30.

When the signal Vattn is high, the fourth transistor D41 is off. The first transistor T41 is biased to amplify. When Vattn is low, the fourth transistor D41 is on. However, first transistor T41 is turned off. The fourth transistor D41 removes the influence of the bias from the control voltage, when Vattn is at a high level.

Figure 4:
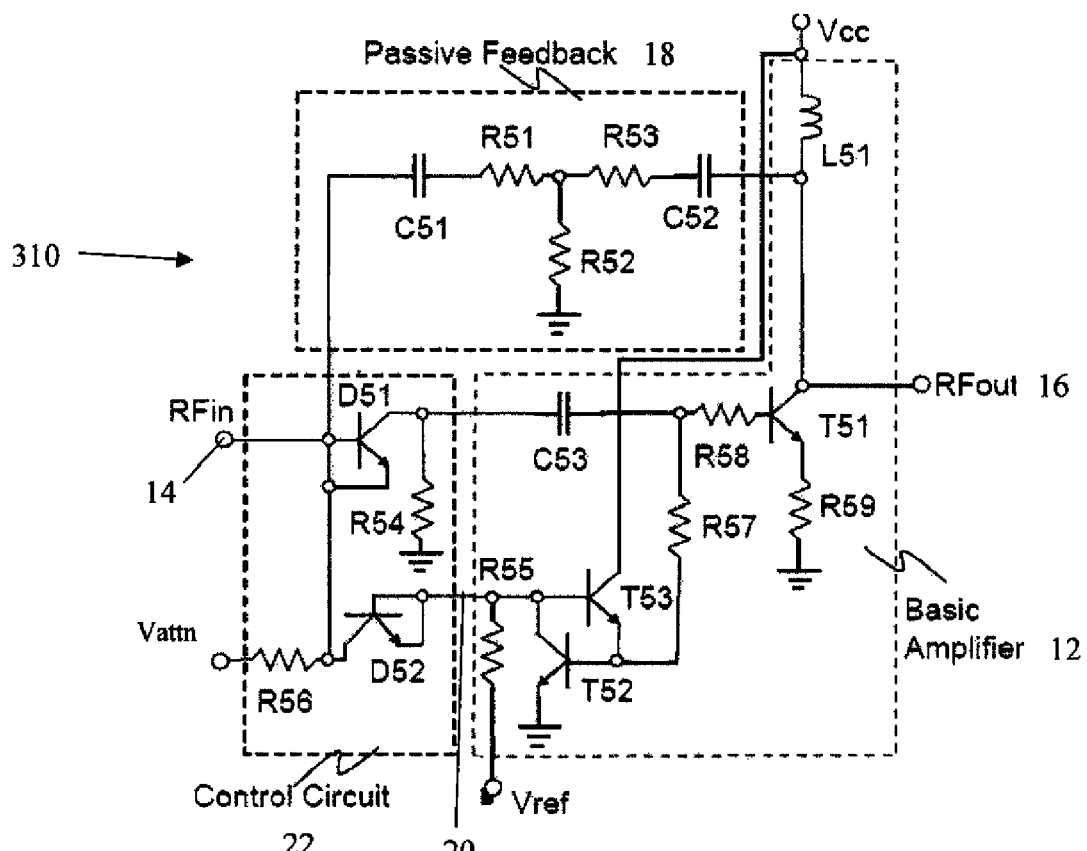
FIG. 4 is a circuit diagram of a third embodiment of the amplifier system of the present invention.

Referring to FIG. 4 there is shown a third embodiment of the amplifier system 310 of the present invention. Again like parts will be designated by the same numerals. The amplifier system 310 comprises a basic amplifier 12. The basic amplifier 12 includes a bias circuit 30, and a first transistor T51. Again, in this embodiment, the first transistor T51 is shown as a n-p-n bipolar transistor. However, the invention is not so limited. The first transistor T51 has a collector which is connected to the RF output node 16. In addition, the collector is connected through an inductor L51 to a voltage source Vcc. The first transistor T51 has an emitter connected through a resistor R59 to ground. Finally, the first transistor T51 has a base, which is connected through a resistor R58 to a capacitor C53.

The bias circuit 30, also functions as a current mirror circuit to the transistor T51. The bias circuit 30 comprises a second n-p-n bipolar transistor T52, and a third n-p-n bipolar transistor T53. The emitter of the second transistor T52 is connected to ground. The collector of the second transistor T52 is connected to the base of the third transistor T53. The base of the second transistor T52 is connected to the emitter of the third transistor T53 and through a resistor R57 through resistor R58, into the base of the first transistor T51. The collector of the third transistor T53 is connected to Vcc. The base of the third transistor T53 is connected through resistor R55 and into Vref. The base of the third transistor T53 is also connected to the bias node 20 and into the control circuit 22.

The control circuit 22 comprises a fourth bipolar transistor D52. The base of the fourth transistor D52 is connected to its emitter which is also connected to the bias node 20. The collector of the fourth transistor D52 is connected through a resistor R56 and receives the control signal Vattn.

The capacitor C53 is also connected to the control circuit 22. The control circuit 22 receives the RF input signal at the node 14. The RF input signal is supplied to the collector of the fourth n-p-n bipolar transistor D52. In addition, the RF input signal is also supplied to the base of a fifth transistor D51. Finally, the RF signal at the input node 14 is connected to the passive feedback circuit 18. The emitter of the fifth transistor D51 is also connected to the base of the fifth transistor D51. The collector of the fifth transistor D51 is connected the capacitor C53 and is also connected to ground through transistor R54.

The passive feedback circuit 18 is similar to the feedback circuit 18 described in the second embodiment of the amplifier system 210 shown in FIG. 3. The feedback circuit 18 comprises a first capacitor C52 connected to a resistor R53 in series, and in series with a resistor R51 in series with a second capacitor C51. The first capacitor C52 is also connected to the collector of the first transistor T51. The second capacitor C41 is connected to the RF input node 14. A resistor R52 connects the junction of the resistor R41 and R43 to ground.

In the operation of the amplifier system 310, when Vattn is at a high level, the fifth transistor D51 is turned on and the fourth transistor D52 is turned off. Thus, the RF signal supplied on the input node 14 is supplied to the transistor T51, via the low impedance of the fifth transistor D51, and is amplified by the first transistor T51. When Vattn is at low level and Vref maintains high voltage, fifth transistor D51 is turned off, fourth transistor D52 is turned on, and current mirror bias circuit 30 is turned off. The RF signal received at the input node 14 will be met by the high impedance of the turned off transistor D51. In addition first transistor T51 will be turned off by the shunt bias. Thus, the input RF signal must pass through the passive feedback circuit 18. Further, in this state, the fifth transistor D51 isolates the RF input signal from the first transistor T51.

From the foregoing it can be seen, that an amplifier system with a high step gain is achieved, with low current consumption in the low gain state, and having low RF distortion at high power input in the low gain state.

What is claimed is:

1. An amplifier system comprising: an amplifier having an input and an output, and a bias circuit; a passive feedback circuit comprising only passive elements connecting the output to the input; and a control circuit connected to the bias circuit, wherein the amplifier has a first transistor coupled between the input and the output; and wherein the bias circuit is connected between the input and a bias node; and wherein the control circuit is connected to the bias node, wherein the passive feedback circuit comprises a first resistor and a first capacitor coupled in series and a second resistor and a second capacitor connected in series and in series with the first resistor and the first capacitor, with the first capacitor connected to the input and the first resistor connected to the second resistor, and with the second capacitor connected to the output; and a third resistor connecting to the junction of the first resistor and the second resistor to ground.

2. The amplifier system of claim 1, wherein the bias circuit comprises a second transistor having a second terminal coupled to the input, a third terminal connected to the bias node and a first terminal connected to ground, with the second terminal controlling the flow of current between the first and third terminals.

3. The amplifier system of claim 2 wherein the bias circuit further comprising: a third transistor, having a second terminal, a third terminal and a first terminal; wherein the second terminal of the third transistor is connected to the third terminal of the second transistor; the first terminal of the third transistor is connected to the second terminal of the second transistor; and the second terminal of the third transistor is coupled to a reference voltage.

4. The amplifier system of claim 3 wherein the third terminal of the third transistor is connected to a supply voltage.

5. An amplifier system comprising: an amplifier having an input and an output, and a bias circuit; a passive feedback circuit comprising only passive elements connecting the output to the input; and a control circuit connected to the bias circuit, wherein the amplifier has a first transistor coupled between the input and the output; and wherein the bias circuit is connected between the input and a bias node; and wherein the control circuit is connected to the bias node, wherein the bias circuit comprises a second transistor having a second terminal coupled to the input, a third terminal connected to the bias node and a first terminal connected to ground, with the second terminal controlling the flow of current between the first and third terminals, and wherein the bias circuit further comprises a third transistor, having a second terminal, a third terminal and a first terminal; wherein the second terminal of the third transistor is connected to the third terminal of the second transistor; the first terminal of the third transistor is connected to the second terminal of the second transistor; and the second terminal of the third transistor is coupled with a reference voltage.

6. The amplifier system of claim 5 wherein the second transistor is of n-p-n bipolar type.

7. The amplifier system of claim 5 wherein the bias circuit further comprises a resistor connected between the second terminal of the third transistor and the reference voltage.

8. The amplifier system of claim 5 wherein the passive feedback circuit comprises a first resistor and a first capacitor coupled in series and a second resistor and a second capacitor connected in series and in series with the first resistor and the first capacitor, with the first capacitor connected to the input and the first resistor connected to the second resistor, and with the second capacitor connected to the output; and a third resistor connecting to the junction of the first resistor and the second resistor to ground.

9. The amplifier system of claim 5 wherein the third terminal of the third transistor is connected to a supply voltage.

10. The amplifier system of claim 1 wherein the control circuit comprises a resistor.

11. The amplifier system of claim 1, wherein the control circuit further comprises: a resistor and a fourth transistor having a first terminal, a second terminal and a third terminal, with the first terminal connected to the bias node, the second terminal connected to the bias node and the third terminal connected to the resistor of the control circuit.

12. The amplifier system of claim 11, wherein the control circuit further comprises: a fifth transistor having a first terminal, a second terminal, and a third terminal, with the first terminal of the fifth transistor connected to the third terminal of the fourth transistor and to the passive feedback circuit, the third terminal of the fifth transistor coupled to the input, and the second terminal of the fifth transistor connected to the passive feedback circuit.

13. The amplifier system of claim 5, wherein the control circuit comprises a resistor.

14. The amplifier system of claim 5, wherein the control circuit further comprises: a fourth transistor having a first terminal, a second terminal and a third terminal, with the first terminal connected to the bias node, the second terminal connected to the bias node and the third terminal connected to the resistor.

15. The amplifier system of claim 14, wherein the control circuit further comprises: a fifth transistor having a first terminal, a second terminal, and a third terminal, with the first terminal of the fifth transistor connected to the third terminal of the fourth transistor and to the passive feedback circuit, the third terminal of the fifth transistor coupled to the input, and the second terminal of the fifth transistor connected to the passive feedback circuit.

16. An amplifier system comprising: an amplifier having an input and an output, and a bias circuit; a passive feedback circuit comprising only passive elements connecting the output to the input; and a control circuit connected to the bias circuit, wherein the amplifier has a first transistor coupled between the input and the output; and wherein the bias circuit is connected between the input and a bias node; and wherein the control circuit is connected to the bias node, wherein the control circuit further comprises: a resistor and a second transistor having a first terminal, a second terminal and a third terminal, with the first terminal connected to the bias node, the second terminal connected to the bias node and the third terminal connected to the resistor of the control circuit.

17. The amplifier system of claim 16, wherein the control circuit further comprises: a fifth transistor having a first terminal, a second terminal, and a third terminal, with the first terminal of the fifth transistor connected to the third terminal of the fourth transistor and to the passive feedback circuit, the third terminal of the fifth transistor coupled to the input, and the second terminal of the fifth transistor connected to the passive feedback circuit.

18. The amplifier system of claim 2 wherein the second transistor is of n-p-n bipolar type.

19. The amplifier system of claim 3 wherein the bias circuit further comprises a resistor connected between the second terminal of the third transistor and the reference voltage.

* * * * *